United States Patent
Tseng et al.

(10) Patent No.: US 6,734,098 B2
(45) Date of Patent: May 11, 2004

(54) METHOD FOR FABRICATING COBALT SALICIDE CONTACT

(75) Inventors: Uway Tseng, Taichung (TW); Hung-Yu Chiu, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/064,699

(22) Filed: Aug. 8, 2002

(65) Prior Publication Data

US 2004/0029376 A1 Feb. 12, 2004

(51) Int. Cl.⁷ .......................................... H01L 21/4763
(52) U.S. Cl. ......................................... 438/637; 638/639
(58) Field of Search ................................. 438/301, 592

(56) References Cited

U.S. PATENT DOCUMENTS

| | | | |
|---|---|---|---|
| 5,576,244 A | * 11/1996 | Hayashi et al. | 438/301 |
| 5,874,342 A | * 2/1999 | Tsai et al. | 438/301 |
| 5,902,129 A | * 5/1999 | Yoshikawa et al. | 438/592 |
| 5,970,370 A | * 10/1999 | Besser et al. | 438/586 |
| 6,169,005 B1 | * 1/2001 | Kepler et al. | 438/301 |
| 6,238,986 B1 | * 5/2001 | Kepler et al. | 438/301 |
| 6,406,998 B1 | * 6/2002 | Prall et al. | 438/659 |

* cited by examiner

Primary Examiner—David Nelms
Assistant Examiner—Thao P. Le
(74) Attorney, Agent, or Firm—Jiang Chyum IP Office

(57) ABSTRACT

A fabrication method for a cobalt-salicide contact is described. A deep sub-micron contact opening is formed on a substrate. A silicon nitride spacer is further formed on the contact sidewall. A cobalt layer is further deposited in the contact opening, followed by sequentially forming an ionized metal plasma titanium layer and a chemical vapor deposited titanium nitride layer. A first rapid thermal process is performed and a wet etching is performed to remove the titanium/titanium nitride layer. A second rapid thermal process is performed, followed by filling the contact opening with a conductive layer.

13 Claims, 2 Drawing Sheets

US 6,734,098 B2

METHOD FOR FABRICATING COBALT SALICIDE CONTACT

BACKGROUND OF THE INVENTION

1. Field of the Invention

The present invention relates to a method for fabricating a contact. More particularly, the present invention relates to a fabrication method for a cobalt-salicide contact.

2. Description of Related Art

Contact is one structure of an interconnect. A contact is typically formed by forming an oxide layer on a silicon substrate, followed by forming an opening In the oxide layer. The opening is then filled with a metal layer. Chemical mechanical polishing (CMP) is further used to remove the metal layer outside the contact.

The current fabrication technique for a contact includes forming a salicide material covering the substrate at the bottom of the contact. Cobalt-salicide, which has a crystalline structure similar to the silicon substrate, is often used in fabricating a contact. However as the ULSI process advances to 0.18 microns and below, the aspect ratio of the contact becomes even higher. The contact barrier layer formed by physical vapor deposition can not cover the bottom of the contact. The unreacted cobalt layer at the bottom of the contact is affected by oxygen gas and the nitrogen gas used in the process, leading to the problem of an undesirable cobalt consumption and an eventual lowering the reliability of the contact.

SUMMARY OF THE INVENTION

Accordingly, the present invention provides a technique for fabricating a cobalt-salicide contact, wherein the reliability of the contact is improved.

The present invention also provides a method for fabricating a cobalt-salicide contact, wherein an undesirable consumption of cobalt is prevented to facilitate the fabrication of cobalt-salicide.

The present invention further provides a cobalt-salicide contact fabrication technique, wherein charge loss due to mobile ions on the contact sidewall is prevented.

In accordance to the present invention, a cobalt-salicide contact fabrication technique is provided, wherein a contact opening is formed on the substrate. An aspect ratio of the contact opening can be, for example, greater than 10. A silicon nitride spacer is further formed on the sidewall of the contact opening. A cobalt layer is then deposited, followed by sequentially depositing an ionized metal plasma (IMP) titanium layer and a chemical vapor deposited (CVD) titanium nitride layer as a capping layer. A first rapid thermal process (RTP) is performed to induce a reaction between the cobalt layer and the silicon substrate to form cobalt-salicide. A wet etching is further performed to remove the titanium/titanium nitride layer and the unreacted cobalt layer. A second rapid thermal process is performed, followed by filling the contact opening with a conductive layer.

The present invention also provides a method for fabricating a cobalt-salicide contact. A deep submicron contact opening Is first formed. A silicon nitride spacer is formed on the sidewall of the contact opening. A cobalt layer is deposited, followed by sequentially forming an IMP Ti layer and a CVD TiN layer. A rapid thermal process is performed. A conductive layer, for example, tungsten is then used to fill the contact opening. Chemical mechanical polishing is further used to remove the conductive layer, the titanium/titanium nitride layer and the cobalt layer outside the contact opening.

According to the present invention, an IMP process is used to form a titanium layer with a good step coverage. A titanium nitride layer formed by chemical vapor deposition is also provided to form a cobalt-salicide contact with an aspect ratio greater than 10. The reliability of a deep sub-micron contact is thus enhanced.

In accordance to the present invention, due to the oxygen gettering ability of the Ti/TiN layer, the cobalt layer is prevented form being oxidized and consumed due to the presence of oxygen. The present invention provides a titanium/titanium nitride layer as a capping layer to prevent the cobalt layer from contacting with the nitrogen gas and from being consumed during the RTP process.

Further, the present Invention provides a titanium layer to separate the cobalt layer from the chemical vapor deposited titanium nitride layer. The cobalt layer is thus prevented from being contaminated by the impurities in the CVD TiN layer.

Additionally, the present invention also provides forming a silicon nitride spacer on the sidewall of the contact after the formation of the contact opening. As the device dimension is further being scaled down, charge loss due to mobile ions on the sidewall of the contact is prevented.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

First Aspect of the Invention

Figure 1:
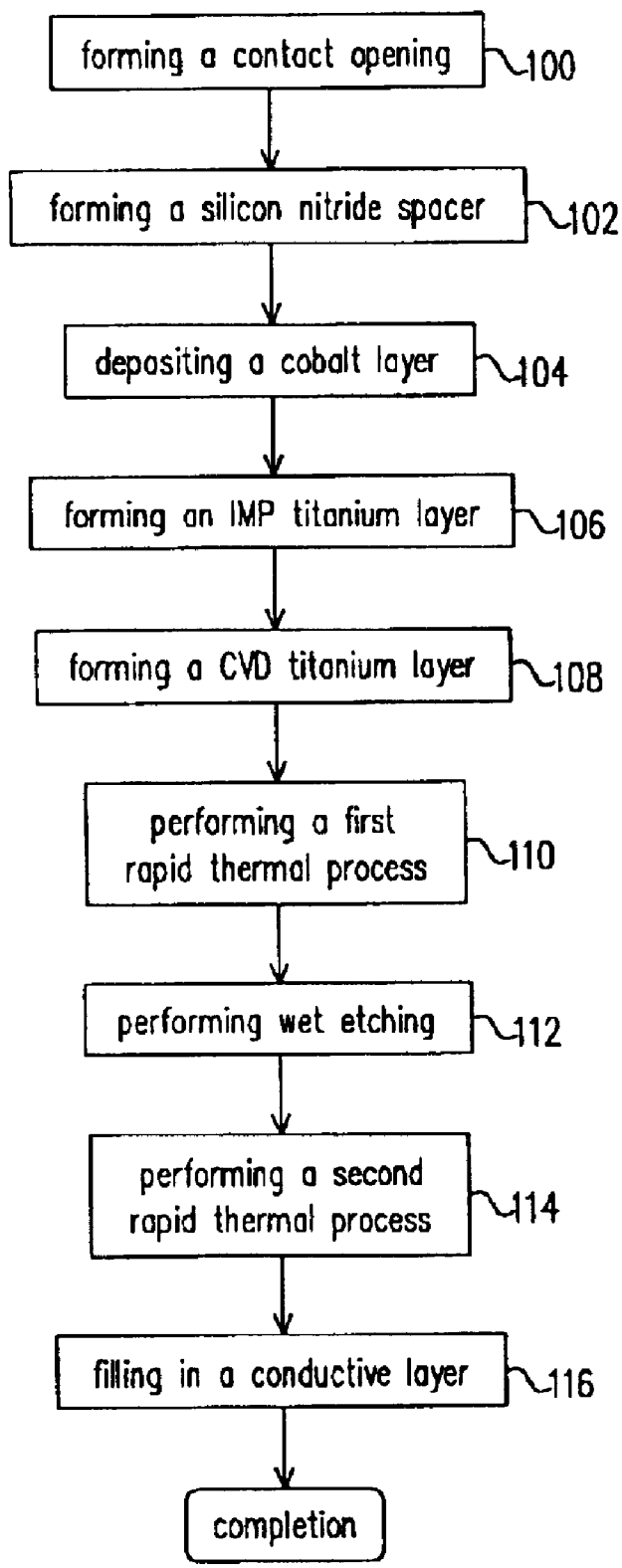
FIG. 1 is a flow chart illustrating the processing steps in forming a cobalt-salicide contact according to one aspect of the present invention.

FIG. 1 is a flow chart illustrating the processing steps In forming a cobalt-salicide contact according to one aspect of the present invention.

Referring to FIG. 1, in step 100, a contact opening is formed as a deep sub-micron contact, wherein the aspect ratio of the contact opening can be, for example, greater than 10. Forming the contact opening includes, for example, depositing a dielectric layer on a silicon substrate of a semiconductor device. Photolithography and etching are further performed to form a contact opening in the dielectric layer to expose the silicon substrate.

Thereafter, in step 102, a silicon nitride spacer having a thickness of about 100 to 200 angstroms is formed on the sidewall of the contact opening. Since the silicon nitride spacer can shield the penetration of the mobile ion, the problem of charge loss at the sidewall of the contact is prevented.

Continuing to step 104, a cobalt layer is deposited. The thickness of the cobalt layer is, for example, 800 to 1000 angstroms. The step coverage of the deposited cobalt layer is about 5%. Therefore, the thickness of the deposited cobalt layer at the bottom of the contact is about 40 to 50 angstroms.

After this, in step 106, an ionized metal plasma (IMP) titanium (Ti) layer having a thickness of about 200 to 300 angstroms is formed on the cobalt layer. The step coverage of the deposited IMP titanium layer is about 50%. Therefore, the titanium layer at the bottom of the contact is about 100 to 150 angstroms thick.

In step 108, a chemical vapor deposited titanium nitride (CVD TiN) layer is formed to a thickness of about 100–200 angstroms. The step coverage of the deposited CVD TiN layer is about 70%. Therefore, the thickness of the titanium nitride layer on the titanium layer at the bottom of the contact opening is about 70 angstroms to about 140 angstroms. The IMP Ti layer and the CVD TiN layer together form a capping layer for the cobalt layer.

Subsequently, in step 110, a first rapid thermal process is performed to induce a reaction between the cobalt layer and the silicon substrate to form cobalt-salicide.

The first rapid thermal process is conducted at a temperature of about 500 to about 600 degrees Celsius and a gas used in the first rapid thermal process comprises nitrogen gas.

Thereafter in step 112, a wet etching is performed to remove the unreacted cobalt layer, IMP titanium layer and the CVD titanium nitride layer. The wet etching is performed at a temperature of about 50 degrees Celsius using an etchant, for example, SC1/SC2.

As shown in Step 114, a second rapid thermal process is performed at a temperature of about 600 to 700 degrees Celsius. Subsequently In step 116, a conductive layer is used to fill the contact opening, wherein the conductive layer, for example, a tungsten layer, fills the contact opening at a temperature of about 400 to 450 degrees Celsius.

Second Aspect of the Invention

Figure 2:
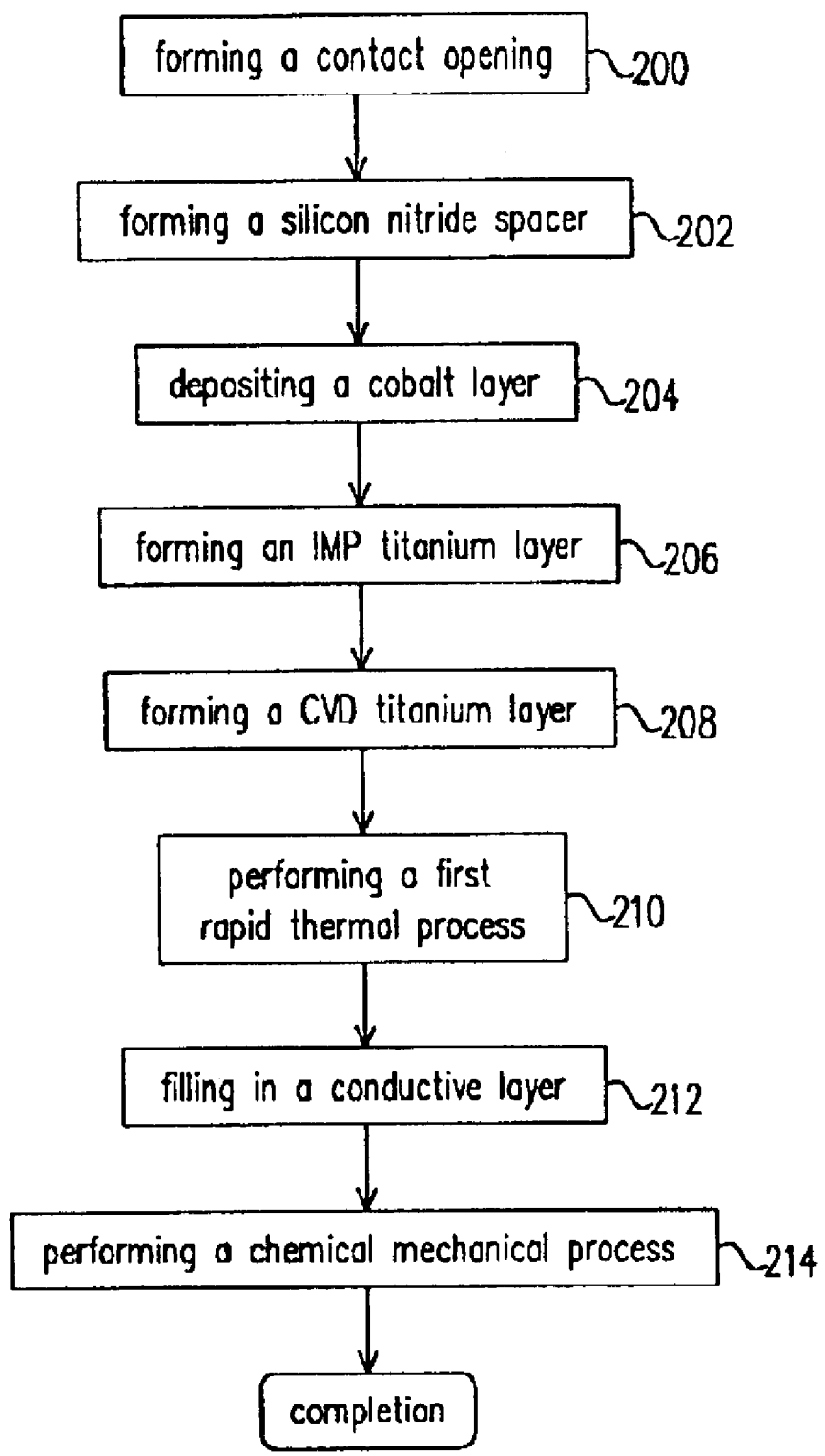
FIG. 2 is a flow chart illustrating the processing steps in forming a cobalt-salicide contact according to another aspect of the present invention.

FIG. 2 is a flow chart illustrating the processing steps in forming a cobalt-salicide contact according to another aspect of the present invention.

Referring to FIG. 2, in step 200, a contact opening having an aspect ratio greater than 10 is formed as a deep submicron contact. Forming the contact opening includes depositing a dielectric layer on a silicon substrate of a semiconductor device, followed by using photolithography and etching to form a contact opening in the dielectric layer.

Continue to step 202, a silicon nitride spacer is formed on the sidewall of the contact opening. The thickness of the silicon nitride spacer is about 100 to 200 angstroms. Thereafter, in step 204, a cobalt layer is deposited to a thickness of about 800 to 1000 angstroms with a step coverage of about 5%. The cobalt layer is deposited over the dielectric layer and in the contact opening. Therefore, the thickness of the cobalt layer at the bottom of the contact opening is about 40 to 50 angstroms.

In step 206, an ionized metal plasma titanium (IMP Ti) layer is then formed on the cobalt layer. The titanium layer is formed to a thickness of about 200 to 300 angstroms with a step coverage of about 50%. The thickness of the titanium layer at the bottom of the contact opening on the cobalt layer is about 100 to 150 angstroms.

After this, in step 208, a chemical vapor deposited (CVD) titanium nitride (TiN) layer is formed on the IMP Ti layer. The titanium nitride layer is formed to a thickness of about 100 to 200 angstroms with a step coverage of about 70%. Therefore, the CVD TiN layer formed on the IMP titanium layer at the bottom of the contact is about 70 to 140 angstroms thick. The aforementioned IMP Ti layer and CVD TiN layer constitute a capping layer.

In step 210, a rapid thermal process Is performed to induce a reaction between the cobalt layer and the silicon substrate to form cobalt-salicide. The processing gas for the rapid thermal process (RTP) comprises nitrogen gas. Subsequently, in step 212, a conductive layer fills the contact opening, wherein the conductive layer Includes tungsten. Filling the contact opening with the conductive layer is performed at a temperature of about 400 to 450 degrees Celsius.

In step 214, a CMP process is performed to remove the conductive layer, the IMP titanium layer and the CVD TiN layer and cobalt layer outside the contact opening, wherein the CMP process Is a tungsten CMP process.

In accordance to the present invention, the ionized metal plasma process that can provide good step coverage is used to form the titanium layer. Chemical vapor deposition is also used to form the titanium nitride layer. A cobalt-salicide contact with an aspect ratio greater than 10 can be formed to further enhance the reliability of a deep sub-micron contact.

Based on the oxygen gettering ability of the IMP Ti/CVD TiN layer, the cobalt layer of the present invention is prevented from being oxidized and consumed due to the presence of oxygen.

Further, the cobalt layer is separated from the CVD TiN layer by a TiN layer to prevent the cobalt layer from being contaminated by the impurities in the CVD TiN layer.

The present invention further provides forming a silicon nitride spacer on a contact sidewall after the formation of the contact opening. Therefore, after the device dimension is being scaled-down, the problem of charge loss due to the presence of mobile Ions on the contact sidewall is thus effectively prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a cobalt-salicide contact, comprising:

forming a dielectric layer on a silicon substrate;

forming a contact opening in the dielectric layer, wherein the opening exposes the silicon substrate;

forming a silicon nitride spacer on a sidewall of the contact opening;

forming a cobalt layer at a bottom of the contact opening;

forming an ionized metal plasma titanium layer on the cobalt layer;

forming a chemical vapor deposited titanium nitride layer on the ionized metal plasma titanium layer;

performing a first rapid thermal process to induce a reaction between the cobalt layer and the silicon substrate to form a cobalt-salicide layer;

performing a wet etching to remove an unreacted cobalt layer, the ionized metal plasma titanium layer, the chemical vapor deposited titanium nitride layer;

performing a second rapid thermal process; and filling the contact opening with a conductive layer.

2. The method of claim 1, wherein the first rapid thermal processes performed at a temperature of about 500 to 600 degrees Celsius.

3. The method of claim 1, wherein the first rapid thermal process is performed with a nitrogen gas.

4. The method of claim 1, wherein the second rapid thermal process is performed at a temperature of about 600 to 700 degrees Celsius.

5. The method of claim 1, wherein a step coverage of the ionized metal plasma titanium layer is about 50%.

6. The method of claim 1, wherein the conductive layer comprises tungsten.

7. The method of claim 6, wherein filling the contact opening with the conductive layer is performed at a temperature of about 400 to 450 degrees Celsius.

8. A fabrication method for a cobalt-salicide contact, comprising:

forming a dielectric layer on a silicon substrate;

forming a contact opening in the dielectric layer, wherein an aspect ratio of the contact opening is greater than 10;

forming a silicon nitride spacer on a sidewall of the contact opening;

forming a cobalt layer at a bottom of the contact opening;

forming an ionized metal plasma titanium layer on the cobalt layer;

forming a chemical vapor deposited titanium nitride layer on the ionized metal plasma titanium layer;

performing a rapid thermal process to induce a reaction between the cobalt layer and the silicon substrate to form a cobalt-salicide layer;

filling the contact opening with a conductive layer; and performing a chemical mechanical polishing process to removed portions of the conductive layer, the ionized metal plasma titanium layer, the chemical vapor deposited titanium nitride layer and the cobalt layer outside the contact opening.

9. The method of claim 8, wherein the rapid thermal process is performed with a gas including a nitrogen gas.

10. The method of claim 8, wherein a step-coverage for the ionized metal plasma titanium layer is about 50%.

11. The method of claim 8, wherein the conductive layer comprises tungsten.

12. The method of claim 11, wherein performing the chemical mechanical process comprises performing a tungsten chemical mechanical process.

13. The method of claim 11, wherein the contact opening is filled with the conducted layer at a temperature of about 400 to 450 degrees Celsius.

* * * * *